United States Patent [19]

Hallman

[11] Patent Number: 4,522,910

[45] Date of Patent: Jun. 11, 1985

[54] PHOTOSENSITIVE GRAPHIC ARTS ARTICLE

[75] Inventor: Robert W. Hallman, San Diego, Calif.

[73] Assignee: Napp Systems (USA), Inc., San Marcos, Calif.

[21] Appl. No.: 442,515

[22] Filed: Nov. 18, 1982

Related U.S. Application Data

[63] Continuation of Ser. No. 51,652, Jun. 25, 1979, abandoned, which is a continuation of Ser. No. 815,899, Jul. 15, 1977, abandoned, which is a continuation-in-part of Ser. No. 588,334, Jun. 19, 1975, abandoned.

[51] Int. Cl.³ .................. G03C 1/54; G03C 1/60; G03C 1/76

[52] U.S. Cl. .................. 430/157; 430/138; 430/155; 430/168; 430/169; 430/175; 430/176; 430/190; 430/192; 430/195; 430/197; 430/270; 430/271; 430/274; 430/281; 430/289; 430/338; 430/905; 430/909; 430/910

[58] Field of Search .............. 430/138, 175, 176, 190, 430/192, 195, 197, 157, 168, 169, 302, 905, 155

[56] References Cited

U.S. PATENT DOCUMENTS

| | | | |
|---|---|---|---|
| 2,822,272 | 2/1958 | Kosalek et al. | 430/176 |
| 2,871,119 | 1/1959 | Weegar et al. | 430/157 |
| 3,100,150 | 8/1963 | Chismar | 430/270 |
| 3,111,407 | 11/1963 | Lindquist et al. | 430/138 |
| 3,382,069 | 5/1968 | Boroheus et al. | 430/302 |
| 3,661,589 | 5/1972 | Notley | 430/168 |
| 3,681,066 | 8/1972 | McGuckin | 430/48 |
| 3,733,200 | 5/1973 | Takaishi et al. | 430/270 |
| 3,765,894 | 10/1973 | Mellan | 430/176 |
| 3,787,208 | 1/1974 | Jones | 430/87 |

Primary Examiner—Charles L. Bowers, Jr.
Attorney, Agent, or Firm—Niro, Daleiden & Jager

[57] ABSTRACT

A novel photosensitive film structure comprises a generally continuous minor phase material and a generally discontinuous major phase material. The minor phase includes a photosensitive compound whose solubility relative to a selected solvent changes upon exposure to electrromagnetic radiation, while the major phase is not photosensitive nor soluble in the solvent. The two phases are uniformly interdispersed throughout the film structure. Imagewise exposure to electromagnetic radiation renders the film structure selectively permeable to the selected solvent, and, after development, the film structure exhibits the chemical and physical properties of the major phase material. The film structure finds varied application in the manufacture of graphic arts articles such as lithographi printing plates and photoresists.

7 Claims, 3 Drawing Figures

PHOTOSENSITIVE GRAPHIC ARTS ARTICLE

This is a continuation of application Ser. No. 051,652, filed June 25, 1979, now abandoned, which in turn is a continuation of Ser. No. 815,899, filed July 15, 1977, now abandoned, which in turn is a continuation-in-part of Ser. No. 588,334, filed June 19, 1975, also now abandoned.

BACKGROUND OF THE INVENTION

The present invention relates generally to photosensitive structures and more particularly to a photosensitive, unilayer, film structure suitable for use in the manufacture of water-processable printing plates and other graphic arts elements.

Many different photosensitive systems are well-known in the art for the manufacture and preparation of lithographic plates. Diazo compounds are, of course, frequently used as the photosensitive component in such systems. The diazo compounds can be formulated to possess several assets which make them desirable for use in this field, including low-cost, long shelf-life, water solubility, and good photosensitivity. However, the ink receptivity of diazo compounds is seriously reduced when they are contacted by water and the inherent durability of diazo resins is relatively low. Accordingly, approaches to the manufacture and preparation of printing plates utilizing diazo compounds have sought to overcome this problem by using lacquer-based developers, or overcoating the diazo with an ultra-violet transmitting lacquer or other material. These approaches, while enjoying some success, result in the loss of the simple water processing of the diazo compound plates and in some instances have required increased exposure times. Moreover, diazo compounds lack sufficient bond strengths to smoother substrates and therefore it has been necessary to provide grained substrate surfaces to increase the mechanical bonding of these photosensitive coatings, in order to achieve useful lengths of press runs.

Another popular photosensitive system employs photopolymers which have both high ink receptivity and durability. These systems, however, generally require special solvents to develop the plate, thereby increasing system complexity compared to simple water processing and, in addition, presenting undesirable ecological waste problems.

SUMMARY OF THE INVENTION

In an attempt to overcome the problems and extend the performance features of prior art photosensitive systems used in the preparation of printing plates and other graphic arts articles, a new photosensitive film structure has been discovered which provides a highly desirable combination of properties in the various articles in which it finds application.

Accordingly, the present invention is directed to a unilayer film structure which includes a generally continuous minor phase and a generally discontinuous major phase. The minor phase comprises a photosensitive material which changes solubility relative to a selected solvent upon exposure to light, while the major phase comprises a particulate material which is not photosensitive and not soluble in the solvent. The film structure may have a maximum thickness up to ten times the average diameter of the particles comprising the major phase, with the two phases uniformly interdispersed throughout the film structure.

It has been found that such a film structure may be made selectively permeable through imagewise exposure to light and thereafter, used in a variety of graphic arts applications wherein selective permeability to fluids is necessary or desirable.

Therefore, it is an object of the present invention to provide a unique photosensitive film structure which may be made selectively permeable to fluids upon exposure to light.

It is a further object of the present invention to provide a photosensitive film structure wherein the photosensitive phase constitutes a minor fraction of the film's mass and volume, thereby offering considerable performance latitude and improvement, and cost reductions as well.

It is a further object of the invention to provide a photosensitive film structure which may be developed by water subsequent to imagewise exposure to light, without the use of either organic or inorganic solvents.

It is also an object of the present invention to provide a photosensitive, unilayer film suitable for use in the manufacture of lithographic or offset printing plates.

It is a further object of the invention to provide a lithographic printing plate in which the ink receptivity and durability of the imaging areas are relatively independent of the exposure technique and the development composition used in making the finished plate.

It is a further object of the invention to provide a unique photoresist material.

It is still another object of the present invention to provide a photosensitive film structure having a high bond strength to a variety of substrates.

A BRIEF DESCRIPTION OF THE DRAWINGS

The novel features which are believed to be characteristic of the present invention are set forth in the appended claims. The invention itself, however, together with its objects and attendant advantages, will be best understood by referring to the following description taken in connection with the accompanying drawings in which FIGS. 1, 2 and 3 are enlarged cross-sectional schematic views, each illustrating an embodiment of the film structure of the present invention. It should be noted, however, that these schematic representations only serve to illustrate the structure and mechanism of the present invention and are not intended to limit the scope thereof.

DETAILED DESCRIPTION OF THE INVENTION

The photosensitive unilayer film composition of the present invention comprises a minor phase material uniformly interdispersed with a major phase material. The minor phase is photosensitive, generally continuous throughout the structure and capable of changing solubility with respect to a given solvent. The major phase comprises a discrete particulate material which is not photosensitive and chosen to be relatively insoluble in the solvent for the minor phase. Thus, the "two-phase" concept of the present invention relates to the physical structure of the phases, one being continuous and the other discontinuous, and the solubility of the phases, one being selectively soluble in a given solvent after imagewise exposure to light while the other phase is insoluble in the solvent irrespective of light exposure.

The photosensitive unilayer film structure of the present invention may be described as a lattice cast from an emulsion-dispersion. Several lattices formed from emulsion-dispersions have been identified, each of which offers various performance features.

Figure 1:
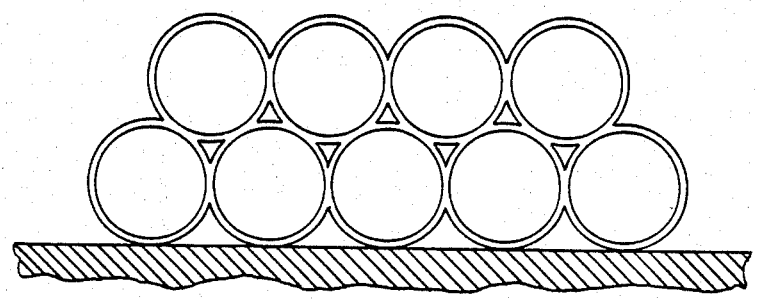

One of the lattices which embodies the concepts of the present invention is illustrated schematically in FIG. 1. This lattice is cast from a dispersion of substantially monodimensional coated spheres and is shown as it might typically be utilized, as a coating on a suitable substrate. Thus, in this system the generally continuous photosensitive minor phase constitutes a coating for the generally discontinuous major phase material.

The minor phase material chosen to wet and coat the second phase particles is soluble in the selected solvent whereas the major phase is insoluble in this solvent. After actinic exposure, however, the minor phase is, for example, rendered insoluble. Thus, after imagewise exposure of the photosensitive structure and upon application of the selected solvent thereto, the unexposed areas of the lattice may be wetted and permeated by the solvent due to the continuing solubility of the first phase coating in those areas. Significantly, this permeation of the lattice permits the physical removal of both the first and second phase materials from the substrate by mechanical techniques such as wiping, brushing, or the like. The wettability and spreading characteristics of the substrate with water and the capillary pressures at the lattice/substrate interface are believed to assist in this "development" process and may thereby offer additional system control.

Figure 2:
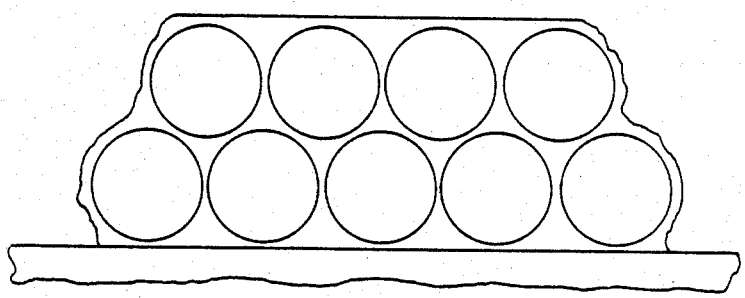

Another lattice embodying the concepts of the present invention is illustrated schematically in FIG. 2. In this lattice system the interstices of the discontinuous major phase material, or void space, is filled with the continuous minor phase photosensitive material. The close packing of the spherical major phase particles, as shown in FIG. 2, results in a void volume of approximately 25% when the spheres are of substantially uniform size. This theoretical void space is independent of actual sphere size so long as uniformity of sphere size is maintained. In accordance with this lattice structure, the interstices between the major phase particles may be filled with a variety of photosensitive materials, such as silver-halide/gelatin, dichromated colloids, photopolymers, diazo-colloid systems and the like. Using this lattice system, imagewise exposure produces in the exposed areas an effective bonding medium for the major phase material, whereas unexposed areas remain water soluble and, therefore, accommodate the desired solvent permeation and subsequent development.

Figure 3:
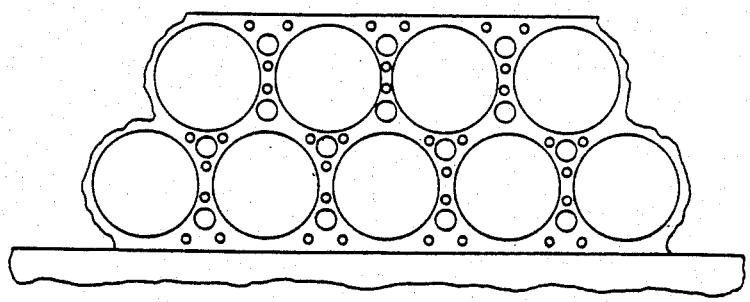

Still another lattice useful in the practice of the present invention is illustrated in FIG. 3. This lattice again includes a generally continuous photosensitive minor phase material as disclosed for the previously mentioned systems interdispersed with a generally discontinuous major phase comprising polydimensional spheres.

As noted above, a matrix of monodimensional spheres will have a void space of approximately 25%. The use of polydimensional spheres results in a reduction of this void space, thereby enabling the use of smaller quantities of the minor phase material in the manufacture of these photosensitive structures. This, of course, may be highly desirable in terms of lower costs and in permitting the physical and chemical characteristics of the major phase to dominate to an even greater extent the properties of the entire film structure.

The photosensitive materials useful as the minor phase in the practice of the invention include any photosensitive compound wherein exposure to electromagnetic radiation creates a change in solubility characteristics in a selected solvent. Photosensitive compounds which may be used in the present invention include aromatic diazo compounds, light sensitive dyestuffs, azo compounds, dichromates, photopolymers, and silver halide gelatin systems. Further useful minor phase materials may be found in the disclosures of U.S. Pat. Nos. 2,063,631 and 2,679,478 and in *Light Sensitive Systems* authored by J. Kosar and published by John Wiley & Sons (1965). Particularly preferred minor phase materials include condensation products of carbonyl compounds, such as formaldehyde or paraformaldehyde, and a diazo compound such as 4-diazo-1,1'-diphenylamine. Such condensation products are available under the trade names Diazo No. 4 and Diazo No. 4L from the Fairmont Chemical Co., Newark, N.J.

The major phase of the film structure of the present invention may be chosen to tailor the physical and chemical properties of the final graphic arts article for a given application. These properties include, among others: durability or physical toughness, the ability to adhere to substrates, water repellency (and therefore ink receptivity), permeability, solvent resistance, particle size, viscosity, solids content, heat sealing characteristics, film forming characteristics and molecular weight.

Some of the homopolymers and copolymers, in emulsion-dispersion form, which are suitable for use as the major phase of the present invention include, among others: acrylics, copolymers of acetate and ethylene, copolymers of styrene and acrylates, polyvinyl acetates, and copolymers of vinyl acetate and acrylates. Each of these may be used with or without protective colloids, wetting agents, plasticizers and other modifying agents.

In accordance with one preferred embodiment of the present invention the photosensitive film structure may be formed by casting onto a suitable substrate an emulsion containing water, a suitable diazo compound, and a PVA-acrylate emulsion. Upon drying, the resulting film structure comprises a continuous diazo compound minor phase which coats the discontinuous PVA-acrylate minor phase spheres and/or fills the interstices thereof. This major phase material is known to form a water insoluble film which is non re-emulsifiable whereas the diazo compounds only become water insoluble upon exposure to light.

Surprisingly, the addition of the diazo resin with this major phase material results in the ability to wash thin layers of the film structure from the substrate subsequent to imagewise exposure to light. Those areas of the film which have been exposed to light are not removed from the substrate during the water wash/scrub process, whereas those portions of the film which are not exposed to light may be removed. Moreover, the light exposed areas exhibit desirable ink receptive properties and efficient bonding even to non-porous surfaces such as silicated, ungrained aluminum.

It is believed that the film structures of the present invention are rendered selectively permeable to a given solvent upon imagewise exposure to light due to the unique physical arrangement of the minor and major phases. Thus in the case of a diazo-PVA/acrylate composition, upon exposure to light the diazo will become insoluble in those portions of the film exposed to light thereby making the entire film structure in those portions impermeable to water. On the other hand, the diazo in those portions of the film not exposed to light will remain water soluble thereby permitting water to permeate the film structure. The permeation of water may create high internal stresses permitting a film splitting failure or it may simply provide access to the substrate promoting adhesive failure.

When such a photosensitive film structure as described herein is utilized with a hydrophylic substrate in the manufacture of lithographic printing plates, those portions of the structure not exposed to light are easily removed during the water development step. It is believed that the water insoluble major phase is capable of removal from the substrate due partly to the action of water at the film/substrate interface, as previously stated, which water has reached this interface due to the permeability of the non-exposed portions of the film. Since the PVA-acrylate copolymer major phase is hydrophobic (and oleophilic), the photosensitive film structures of the present invention are ideally suited for use in lithographic offset printing processes. Moreover, since the major phase material is not light sensitive and is not affected by the light exposure and developing processes, it may be selected largely for the purpose of optimizing the ink receptivity, durability, and bonding properties of the resulting plates.

It will be appreciated from the foregoing that films made in accord with the present invention, because of their two phase structure, may be compounded from a wide variety of materials to optimize both development and performance characteristics. The photosensitive phase, being a relatively minor constituent, does not interfere with the performance characteristics of the film and may be chosen largely for desirable development properties; while the major phase may be chosen to optimize the film's physical and chemical properties for a given application without regard to development. In addition, since the photosensitive phase is a minor constituent, the particles of the major phase material will be closely packed in the film structure, as illustrated schematically in the drawings. Thus, the particles of the major phase are sufficiently proximate to one another to permit their coalescence by means of heat or chemical treatment after the film has been developed. Such post development coalescence has been found to significantly enhance the performance of lithographic printing plates made in accord with the present invention.

In accordance with another application of the present invention, and by proper choice of the major phase material, thickness and substrate, it is possible to create both hydrophobic and hydrophilic characteristics in the film, itself, which are relatively independent of those of the substrate. In such cases, after imagewise exposure, the photosensitive minor phase of the film retains its solubility in the unexposed areas such that a porous surface can be obtained by leaching with the selected solvent. By developing the film without scrubbing or brushing, the major phase material retains substantial structural continuity over the substrate. Thus, the unexposed, porous areas thereof may thereafter be mechanically wetted with water, whereas the exposed areas are non-porous and exhibit hydrophobic characteristics. This "wettability" differential over the surface of the film has been found suitable for lithographic printing and thereby frees the manufacturer to choose any low cost substrate material for use therein.

The utilization of the improved photosensitive, unilayer film structures of the present invention has been illustrated above in the content of the manufacture and preparation of lithographic offset printing plates. It is to be understood, however, that the scope of the present invention is not intended to be so limited. The photosensitive film structures of the present invention may be utilized in other applications wherein selective permeability to a given fluid or solvent is desirable. For example, numerous photoresist applications may also be practicable with the photosensitive structures of the instant invention. Of course, the major phase material may be chosen and tailored to the appropriate environment. Thus, resistance to certain acids or bases or a necessary dielectric constant for plating resist applications will point those skilled in the art to the selection of a particular major phase material. Once chosen a compatible photosensitive phase may be added and the desired performance obtained.

It will be appreciated that development ease for the photosensitive structures of the present invention is proportionally related to the concentration of the minor phase material; that is, easier development occurs at higher minor phase concentration. On the other hand, it is often preferable to minimize the concentration of the minor phase, since the major phase material provides the improved durability, bonding properties and printing characteristics which form an important part of the present invention. Accordingly, the relative amounts of the first and second phase materials utilized will depend upon the properties sought to be obtained in the given photosensitive structure. By way of illustration, however, the amount of minor phase diazo material utilized in Example III set forth in detail below may range from 0.03 to 10 weight percent without significantly affecting the final product. Similarly, for the diazo/polyvinyl acetate system utilized in Example IV, the minor phase should constitute less than about 10 percent, by weight, of the film in order to achieve the desired structure of the present invention. Preferably, the minor phase should constitute between about 2 and 6 percent, by weight, of the film. While it must be emphasized that such quantitative analyses are dependent upon the size of the particulate material comprising the major phase; nevertheless, the quantity of minor phase material used in practicing the present invention should be sufficiently small to allow post development coalescence of the major phase. Otherwise, the physical and chemical properties of the major phase would not dominate the film structure's characteristics.

The thickness of the photosensitive film composition also affects the development of the photosensitive structure, since the solvent must permeate a greater distance to reach the substrate when thicker films are employed. Moreover, the particle size of the major phase material influences the development rate, since for a given film thickness smaller major phase particles result in a more tortuous or circuitous development path as the minor phase solvent permeates to the substrate. Accordingly, it has been determined that a film thickness greater than about 10 times the average diameter of the major phase particles is unsuitable in the practice of the present invention since development time becomes excessive. Preferably, the film thickness is less than about five times the average diameter of the major phase particles. By way of example, many of the major phase materials listed hereinabove are composed of particles with diameters substantially in the range of 0.5 to 3.0 microns. It has been determined empirically, that for film structures using such major phase materials a maximum film thickness less than about 10 microns is preferred. It is apparent, therefore, that the present invention is directed to very thin photosensitive film structures, thereby minimizing the cost of expensive compounds used in the formulation of these structures. Nevertheless, these thin film structures are surprisingly durable and resistant to abrasion due to the fact that major phase materials may be employed to optimize these properties.

The photosensitive film structures of the present invention also exhibit improved light sensitivity as compared to many prior art systems. For example, the photosensitive printing plates described herein may be "activated" by actinic exposure about 3–5 times faster than conventional wipe-on diazo plates. this improved photosensitive responsiveness offers further advantages. For example, since development efficancy is influenced significantly by the wetability and permeability of the surface of the film, a brief actinic exposure which acts only at the surface or near-surface levels has proven effective in permitting selective permeation and development. Such a brief exposure technique may be preferred particularly in those instances where heat is used subsequent to development since in such cases the finished structure's ink receptivity and durability bear no relationship to exposure. In addition, since relatively thin films are employed, enhanced image quality and resolution are obtainable in producing lithographic printing plates.

The following examples, while not intended to be taken as limiting the scope of the present invention, will serve to illustrate the process and compositions for making the photosensitive structures of the present invention.

EXAMPLE I 100 ml of Rhoplex AC-388 (an acrylic emulsion vehicle available from Rohm & Haas, Philadelphia, Pa.), 10 ml of water, and 2 grams of Diazo 4L are blended for about 5 minutes or until well mixed. This admixture is then used to charge a roller coater and applied to a brush grained aluminum substrate to form a dry film having a thickness of about 5 microns. Air drying occurs in about 2 minutes. The sensitized plate is then placed in vacuum contact with a film negative and exposed for 15 seconds to the output of a 2 KW Xenon light source. After exposure the plate is developed with ordinary tap water and gummed. The plate is then mounted on an offset press using conventional fountain solutions and ink. Up to 80,000 high quality copies are obtained with minimal image deterioration.

EXAMPLE II 100 ml of Elvace 1875 (a water based acetate/ethylene copolymer emulsion available from DuPont, Wilmington, Del.), 5 ml of water, and 1 gram of Diazo (a light sensitive material available from Graf-Com Co., Easton, Md.) are blended until well-mixed or about 2 minutes in a conventional stir-mixer. This admixture is then wiped onto a brush grained aluminum substrate and dried to a film thickness of about 2 microns. Air drying occurs in about 1 minute. The sensitized plate is then placed in vacuum contact with a film negative and exposed for about 30 seconds to the output of a 2 KW Xenon light source. After exposure the plate is developed with tap water and gummed conventionally. The plate is then mounted on an offset press (e.g., 1250 Addressograph/Multigraph) and printed using a conventional alkaline fountain solution and an ink. Several thousand copies were obtained.

EXAMPLE III 100 ml of Gelva TS 100 (a water based polyvinyl acetate/long chain acrylate copolymer emulsion available from Monsanto Corp., Newport Beach, Calif.), 10 ml of water, and 4 grams of Diazo 4L are blended until well mixed. This admixture is applied to an ungrained silicated aluminum substrate and dried to a thickness of about 5 microns. Air drying occurs in about 2 minutes. The sensitized plate is then placed in vacuum contact with a film negative and exposed for 5 seconds to the output of a 3 KW Mercury Vapor light source. After exposure the plate is developed with ordinary tap water. After development the plate is mounted onto an offset press and printed using conventional press materials. Six thousand high quality copies were obtained with no apparent image wear.

EXAMPLE IV 100 ml of Gelva TS 30 and 100 ml of Gelva S 52 (both water based polyvinyl acetate emulsions available from Monsanto Corp., Newport Beach, Calif.) and 2 grams of Diazo are blended for about 2 minutes. This admixture is applied to a brush grained aluminum substrate and dried to a film thickness of about 10 microns. Two sensitized plates made as disclosed above are then placed in vacuum contact with a film negative and exposed for 60 seconds to the output of a 3 KW Xenon light source. After exposure the plates are developed with tap water and gummed. One plate is then placed in a convection oven set at 250° F. for 2 minutes. Comparison testing reveals much greater durability and higher ink receptivity of the heated sample. Both plates, however, provide high quality copies. About 50,000 copies were obtained with the unheated plate, and over 200,000 copies were obtained with the heated plate.

EXAMPLE V 100 ml of Gelva TS 100, 50 ml of water, and 1 gm of Diazo 4L are blended until well mixed (about 1 minute). This admixture is then applied to a telurium clad mylar substrate and dried to a film thickness of about 2 microns. Air drying occurs in about 1 minute. The sensitized plate is then placed in vacuum contact with a film negative and exposed for 10 seconds to the output of a 3 KW Mercury Vapor light source. After exposure the plate is dip developed in an aqueous solution of NaOCL and NaOH without scrubbing or brushing. Inspection of the plate reveals that the tellurium has been etched by the solution in the unexposed areas and that the film coating of the plate is intact. Thus, no removal occurred but rather only a selective permeation.

EXAMPLE VI 50 ml of Gelva TS 100, 50 ml of water, and 2 grams of Diazo are blended until well mixed (about 2 minutes in a stir-mixer). This admixture is then applied to a ball grained non-silicated aluminum substrate and dried to a film thickness of about 2 microns. Air drying occurs in about 2 minutes. The sensitized plate is then placed in vacuum contact with a film negative and exposed for 30 seconds to the output of a 2 KW Xenon light source. After exposure the plate is developed via simple tap water wetting and rinsing. No wiping is used and the coating remains intact. The plate is then tested for differential wetting and inking by wetting with a conventional fountain solution and inking with a cotton swab and ink. Selective imagewise inking is observed and confirms the fact that the unexposed areas are rendered water wettable due to the leached diazo and resulting porosity.

EXAMPLE VII 50 ml of TS 30 and 50 ml of TS98 (both polyvinyl acetate, water based emulsions from Monsanto Corp., Newport Beach, Calif.) and 2 grams Diazo 4L are blended until well mixed (about 2 minutes in a conventional stir-mixer). This admixture is then applied to a shallow grained and a deep grained aluminum substrate. The films are dried in air in about 3 minutes to a thickness of about 8 microns. The sensitized plates are then placed in vacuum contact with a film negative and exposed for 90 seconds to the output of a 3 KW Xenon light source. After exposure the plates are developed using tap water and gentle scrubbing and then gummed. Both plates are subjected to a heat treatment at 250° F. for 2 minutes and then mounted on a commercial web lithographic press. No signs of image wear are observed after printing over 150,000 impressions on either the shallow grain plate or the deeper grained plate.

| EXAMPLES VIII–XII | | |
|---|---|---|
| Example | Emulsica-Dispersion | Photosensitive Material |
| VIII | 100 parts by weight Galva TS65 (water based polyvinyl acetate available from Monsanto Corp.) | 0.5 parts by weight Anthraquinone Sulfonic Acid Sodium Salt (AQS) |
| IX | Same | 0.6 parts by weight AQS + Ferric Ammonium Citrate |
| X | Same | 0.6 parts by weight AQS + P-Toluene Sulfonic Acid |
| XI | Same | 0.6 parts by weight AQS + Acryl Phosphate |
| XII | Same | 0.6 parts by weight AQS + 4, 4'-Diazide Stilbene-2, 2'-Disulfonic Acid, Sodium Salt |

Each of these formulations was blended until well mixed and then whirl coated onto a grained aluminum substrate and dried at 45° C. for about five minutes. The samples were then exposed from about 15 to 40 seconds at 15 cm to the radiation from a 450 watt chemical lamp. After exposure, each sample was developed in tap water at 15°–20° C. for a few seconds with light mechanical action (rubbing). The resulting lithographic plates were then inked and found to provide quality lithographic performance.

EXAMPLE XIII 150 ml of Polyco 2186 (a water based polyvinyl acetate copolymer emulsion having a solids concentration of 50% and marketed by the Borden Chemical Co.), 35 ml of water and 8 grams of $(NH_4)_2Cr_2O_7$ are blended until well mixed and hand coated using a conventional draw bar technique onto an aluminum substrate. The cast emulsion was dried with forced air flow at room temperature for about 30 seconds, exposed to a 3 KW Mercury Vapor light source for 10 seconds and then developed with tap water at room temperature. The resulting lithographic plate provided excellent lithographic performance.

EXAMPLE XIV 50 parts by weight Gelva TS 65 (see Examples VIII–XII) and 1 part by weight of a mixture of 100 parts water and 1 part photopolymer (disclosed in U.S. Pat. No. 3,801,328 issued to Takimoto and incorporated herein by reference) are blended until well mixed and draw bar coated onto an aluminum substrate. The cast emulsion is dried by forced air flow at room temperature, exposed to a 3 KW radiation source for 60 seconds and then water developed at room temperature. The resulting imaged plate provides excellent lithographic performance.

EXAMPLE XV

A mixture (A) of Polyco 2186, carbon black, water and a surfactant was ball milled for 8 hours. To this was added a mixture (B) of a Polyco 2186, water and diazo 4L and milled for an additional 8 hours. The following proportions were used:

| | Mix A |
|---|---|
| 50 g | Polyco 2186 |
| 9 g | Carbon black |
| 35 g | $H_2O$ |
| 3 g | Surfactant |
| | Mix B |
| 300 g | Polyco 2186 |
| 60 g | $H_2O$ |
| 10 g | 4L |

The resulting emulsion was cast on a synthetic paper (such as a synthetic paper marketed under the trade name Kimdura by Kimberly-Clark), dried, exposed to a 2–5 KW light source for 30 seconds and water developed. The dried article exhibited good abrasion resistance and high contrast images useful for image proofing purposes.

EXAMPLE XVI

A mixture of 9 grams Phthalocyanine Blue pigment, 80 ml of water and a surfactant was milled for 4 hours. 300 ml of 81 B Cascokes (a water based polyvinyl acetate and acrylic copolymer emulsion marketed by the Bordon Co.) and 10 grams of Diazo 4L were added, and the mixture milled an additional 2 hours. The resulting emulsion was cast on mylar, dried, light exposed and developed with water. The resulting transparent article exhibits high abrasion resistance and is useful as a color proof.

It should be understood that the terms "generally continuous" and "generally discontinuous" as used herein refer to the overall character of the minor and major phases, respectively. Thus, while the minor phase may have random and remote discontinuities, it will, over the film structure as a whole, comprise a continuous unbroken material. Similarly, the major phase may have a few particles joined to adjacent particles, yet over the film structure as a whole the major phase will comprise discrete particles separated by the minor phase.

It should also be understood that various changes and modifications of the invention as described herein will be apparent to those skilled in the art. Such changes and modifications can be made without departing from the spirit and scope of the invention and without diminishing its attendant advantages. For example, passive fill materials may be used to improve shelf life to enhance color or to provide special photo, magnetic or electrical properties. It is, therfore, intended that such changes and modifications be covered by the following claims.

I claim:

1. A graphic arts article comprising a plastic substrate having applied on at least one side thereof a unilayer photosensitive film structure cast from an emulsion-dispersion and comprising a generally continuous phase and a generally discontinuous phase uniformly dispersed throughout the entire film structure, said continuous phase being a minor constituent by weight of said film structure and including a photosensitive diazo compound whose solubility with respect to a given aqueous developer is changed upon exposure to electro-magnetic radiation, said discontinuous phase comprising a polymeric particulate material which is substantially insoluble in said aqueous developer, said film structure having a maximum thickness not greater than ten microns, and said film structure being selectively developable to produce an image after exposure by dissolution and removal of the soluble portion of said continuous phase by said aqueous developer.

2. The graphic arts article of claim 1 wherein said photosensitive material is a condensation product of a carbonyl compound and a diazo compound.

3. The graphic arts article of claim 1 wherein said photosensitive material is a salt of condensation products of a carbonyl compound and 4-diazo-1, 1'-diphenylamine.

4. The graphic arts article of claim 1 wherein said polymeric particulate material is selected from the group consisting of polyvinyl acetate, polyacrylics, and copolymers thereof.

5. The graphic arts article of claim 1 wherein said film structure is cast from a water based polymeric emulsion-dispersion and said photosensitive material is a water-soluble diazo compound which is rendered water insoluble upon actinic exposure.

6. The graphic arts article of claim 1 further including a coloring agent in said emulsion dispersion.

7. A graphic arts article comprising a plastic substrate having applied on at least one side thereof a unilayer photosensitive film structure cast from an emulsion-dispersion including a carbon black coloring agent and comprising a generally continuous phase and a generally discontinuous phase uniformly dispersed throughout the entire film structure, said continuous phase being a minor constituent by weight of said film structure and including a photosensitive diazo compound whose solubility with respect to a given aqueous developer is changed upon exposure to electro-magnetic radiation, said discontinuous phase comprising a polymeric particulate material from the group consisting of polyvinyl acetate, polyacrylics and copolymers thereof and which is substantially insoluble in said aqueous developer, said film structure having a maximum thickness not greater than ten microns, and said film structure being selectively developable to produce an image after exposure by dissolution and removal of the soluble portion of said continuous phase by said aqueous developer.

* * * * *